United States Patent
Hsu (10) Patent No.: US 6,821,844 B2
(45) Date of Patent: Nov. 23, 2004

(54) COLLAR DIELECTRIC PROCESS FOR REDUCING A TOP WIDTH OF A DEEP TRENCH

(75) Inventor: Ping Hsu, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/643,169

(22) Filed: Aug. 18, 2003

(65) Prior Publication Data

US 2004/0203203 A1 Oct. 14, 2004

(30) Foreign Application Priority Data

Apr. 10, 2003 (TW) .......................................... 92108222

(51) Int. Cl.[7] ........................................ H01L 21/8242
(52) U.S. Cl. ........................ 438/246; 438/243; 438/249
(58) Field of Search ................................ 438/249, 243, 438/246

(56) References Cited

U.S. PATENT DOCUMENTS

| | | | | |
|---|---|---|---|---|
| 6,008,104 A | * | 12/1999 | Schrems | 438/386 |
| 6,018,174 A | * | 1/2000 | Schrems et al. | 257/296 |
| 6,265,741 B1 | * | 7/2001 | Schrems | 257/301 |
| 6,310,375 B1 | * | 10/2001 | Schrems | 257/301 |
| 6,319,788 B1 | * | 11/2001 | Gruening et al. | 438/386 |
| 6,362,040 B1 | * | 3/2002 | Tews et al. | 438/246 |
| 6,417,064 B1 | * | 7/2002 | Lin et al. | 438/386 |
| 6,551,875 B2 | * | 4/2003 | Tsao | 438/246 |

* cited by examiner

Primary Examiner—David Nelms
Assistant Examiner—Thao P. Le
(74) Attorney, Agent, or Firm—Quintero Law Office (57) ABSTRACT

A collar dielectric process for reducing a top width of a deep trench. A semiconductor silicon substrate has a deep trench and a deep trench capacitor. The deep trench capacitor has a node dielectric formed on the sidewall and bottom of the deep trench, and a storage node formed in the deep trench and reaching a predetermined depth. An ion implantation process is performed to form an ion implantation area on the substrate at the top of the deep trench. Then, the node dielectric is removed until the top of the node dielectric is leveled off with the top of the storage node, thus exposing the sidewall of the deep trench outside the deep trench capacitor. Next, an oxidation process is performed to grow a first silicon oxide layer on the exposed sidewall of the deep trench, in which the first silicon layer is outside the ion implantation area.

13 Claims, 16 Drawing Sheets

COLLAR DIELECTRIC PROCESS FOR REDUCING A TOP WIDTH OF A DEEP TRENCH

BACKGROUND OF THE INVENTION

1. Field of the Invention

The invention relates to a deep trench capacitor, and more particularly to a collar dielectric process for a deep trench capacitor in order to reduce the top width of the deep trench.

2. Description of the Related Art

A DRAM cell comprises a transistor coupled to a capacitor. Currently in the semiconductor industry, DRAM cell includes a deep trench capacitor and a planar transistor. The deep trench capacitor is a three dimensional structure formed in a silicon substrate, and has the advantages of smaller memory area, lower power consumption and higher operating speed.

Figure 1A:
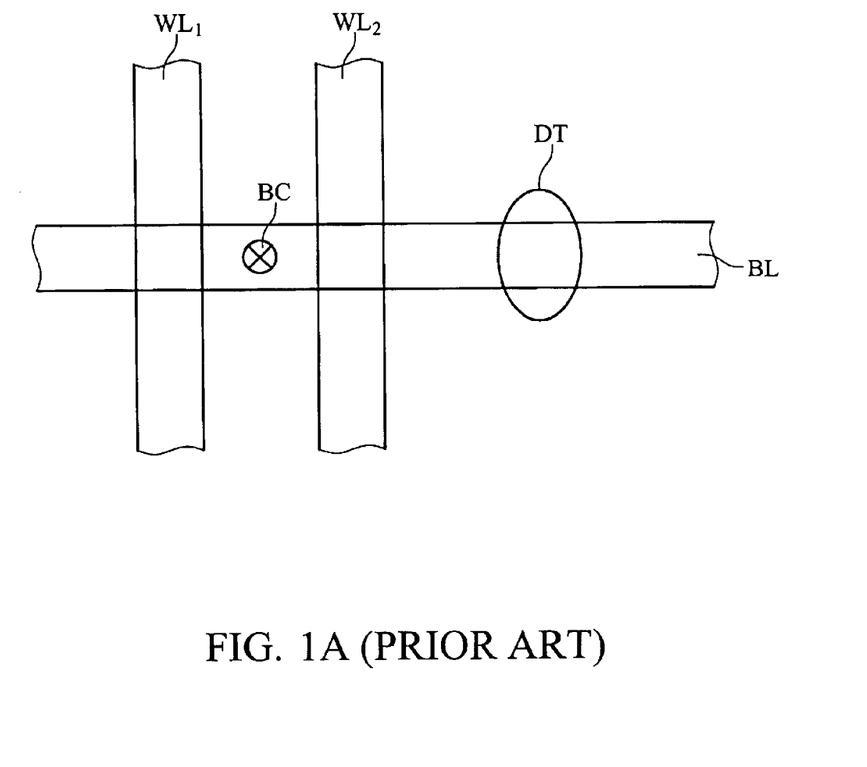
FIG. 1A is a plane view illustrating the arrangement of deep trenches, word lines and bit lines in a conventional DRAM cell.

FIG. 1A is a plane view illustrating the arrangement of deep trenches, word lines and bit lines in a conventional DRAM cell. For a folded bit line structure, each active area comprises two word lines $WL_1$ and $WL_2$ and one bit line BL, in which the character "DT" indicates the deep trench, and the character "PC" indicates a bit line contact.

Figure 1B:
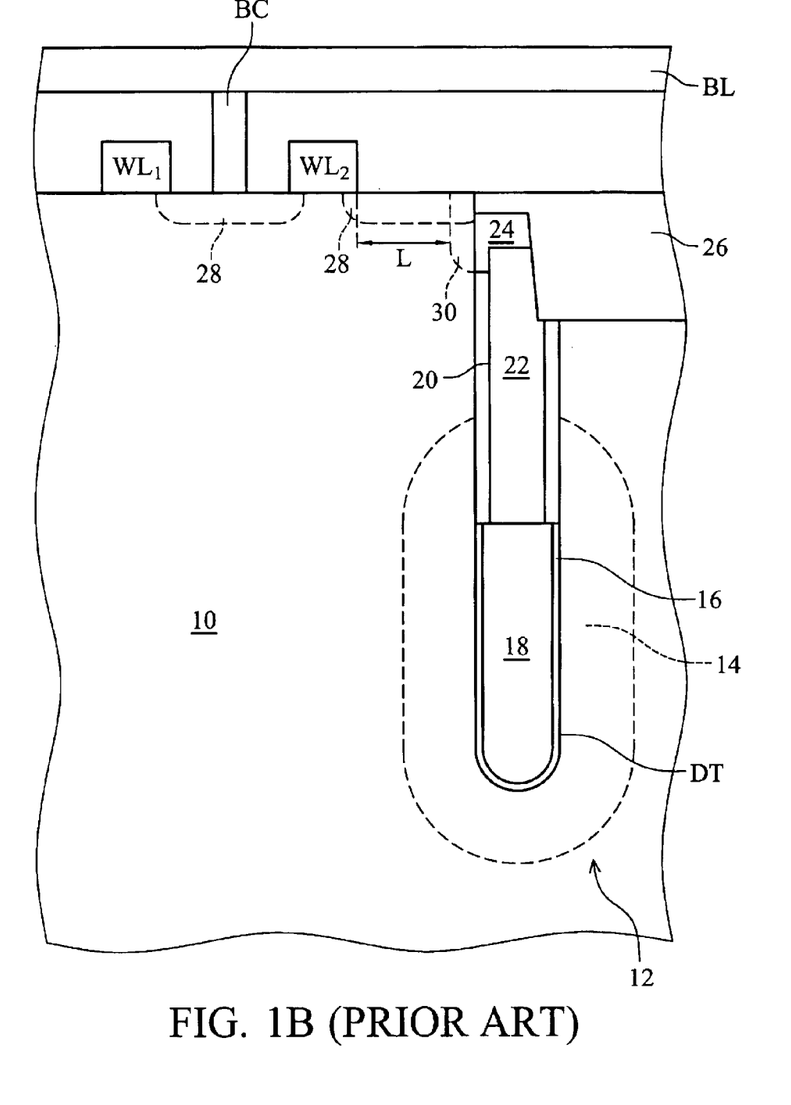
FIG. 1B is a cross-section illustrating a conventional deep trench capacitor of a DRAM cell.

FIG. 1B is a cross-section illustrating a conventional deep trench capacitor of a DRAM cell. A deep trench DT is formed in a silicon substrate 10, and a deep trench capacitor 12 is formed in the lower portion of the deep trench DT. The deep trench capacitor 12 is composed of a buried plate, a node dielectric and a storage node. The conventional method of forming the deep trench capacitor 12 employs the following steps. First, a reactive ion etching (RIE) method is used to form the deep trench DT in the p-type silicon substrate 10. A high-temperature and short-term annealing process using a heavily-doped oxide material (such as ASG) is performed. $N^+$ ions are diffused into the silicon substrate 10 at the lower portion of the deep trench DT, thus forming an $n^+$-type diffusion region 14 to serve as the buried plate of the deep trench capacitor 12. Next, a silicon nitride layer 16 is formed on the sidewall and bottom of the lower portion of the deep trench DT to serve as the node dielectric of the deep trench capacitor 12. Next, a first $n^+$-doped polysilicon layer 18 is deposited to fill the deep trench DT after which it is recessed to reach a predetermined depth, thus serving as the storage node of the deep trench capacitor 12.

After completing the deep trench capacitor 12, a collar dielectric layer 20 is formed on the sidewall of the upper portion of the deep trench DT, after which a second $n^+$-doped polysilicon layer 22 is deposited to fill the deep trench DT. Then, a third polysilicon layer 24 is formed over the second polysilicon layer 22. Subsequently, processes for STI (shallow trench isolation) structure 26, the word lines $WL_1$ and $WL_2$, a source/drain diffusion region 28, and the bit line contact BC and the bit line BL are performed thereon. The STI structure 26 is used to isolate two adjacent DRAM cells.

In addition, a buried strap outdiffusion region 30 is formed in the silicon substrate 10 at the top portion of the deep trench DT for connecting the deep trench capacitor 12 to a planar transistor. Thus, the buried strap outdiffusion region 30 is also called a node junction. Typically, using thermal annealing, the $n^+$ ions of the second polysilicon layer 22 can diffuse into the silicon substrate 10 through the third polysilicon layer 24 to form the buried strap outdiffusion region 30. Thus, the third polysilicon layer 24 is also called a buried strap 24.

The collar dielectric layer 20 is required to isolate the buried strap outdiffusion region 30 from the buried plate 14 because current leakage of the buried strap outdiffusion region 30 to the buried plate 14 may degrade the retention time of the DRAM cell. The conventional method for the collar dielectric layer 20 increases the top width of the deep trench DT, which limits the WL-DT (word line to deep trench) overlay tolerance and the distribution of the buried strap outdiffusion region 30. Particularly, the increased top width of the deep trench DT reduces an overlay margin area L between the source/drain diffusion region 28 and the buried strap outdiffusion region 30, resulting in serious junction leakage and worse sub-Vt performance.

Figure 2A:
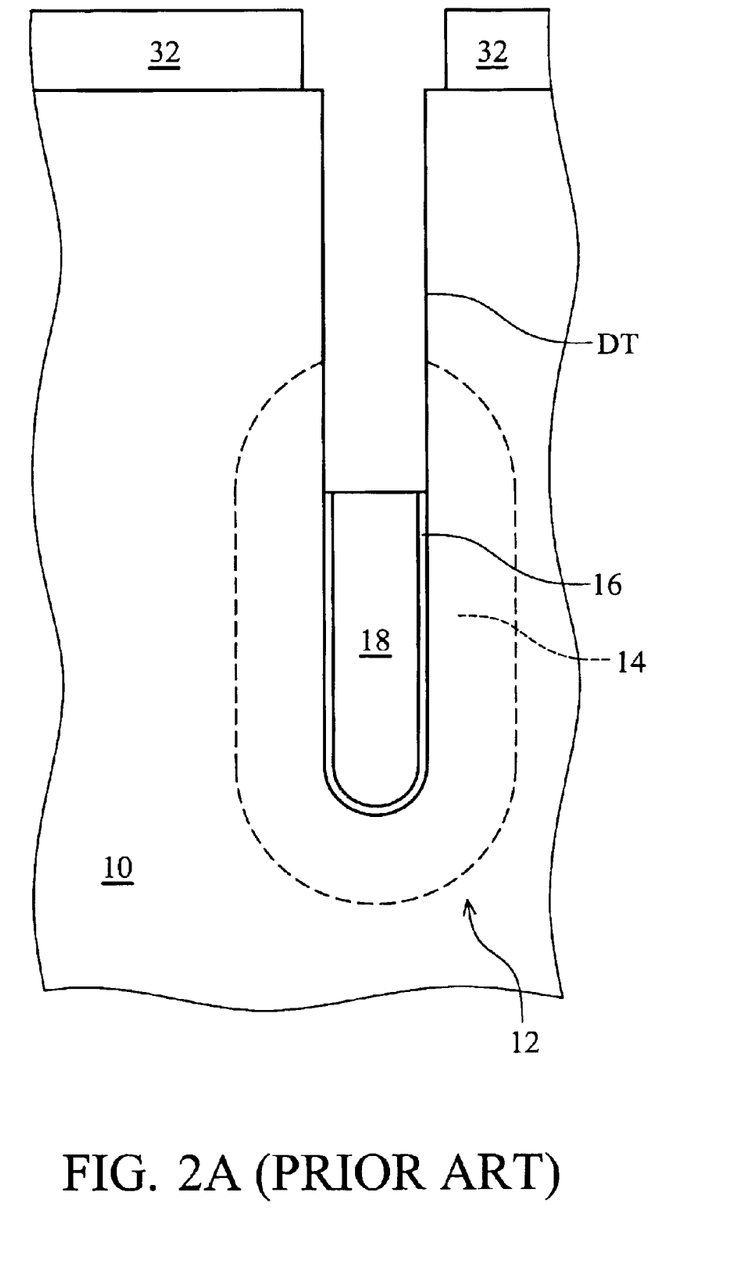
FIGS. 2A to 2E are cross-sections illustrating a conventional method of forming the collar dielectric layer 20 shown in FIG. 1B.

FIGS. 2A to 2E are cross-sections illustrating a conventional method for the collar dielectric layer 20 shown in FIG. 1B. In FIG. 2A, the p-type semiconductor silicon substrate 10 is provided with the deep trench capacitor 12 at the lower portion of the deep trench DT. The capacitor process includes steps of forming a silicon nitride pad layer 32, the deep trench DT, the $n^+$-type diffusion region 14, the silicon nitride layer 16 and the $n^+$-doped first polysilicon layer 18. Then, in FIG. 2B, the silicon nitride layer 16 is removed from the upper portion of the deep trench DT, after which the first polysilicon layer 18 is recessed. Next, an oxidation process is performed to grow a first silicon oxide layer 34 on the exposed surface of the silicon substrate 10. The first silicon oxide layer 34 covers the sidewall of the upper portion of the deep trench DT to ensure the isolation result between the $n^+$-type diffusion region 14 and the buried strap outdiffusion region 30 which will be formed in subsequent processes. Next, in FIG. 2C, a chemical vapor deposition (CVD) method is employed to conformally deposit a second silicon oxide layer 36, after which an anisotropic dry etching method is employed to remove the second silicon oxide layer 36 from the top of the first polysilicon layer 18.

Figure 2B:
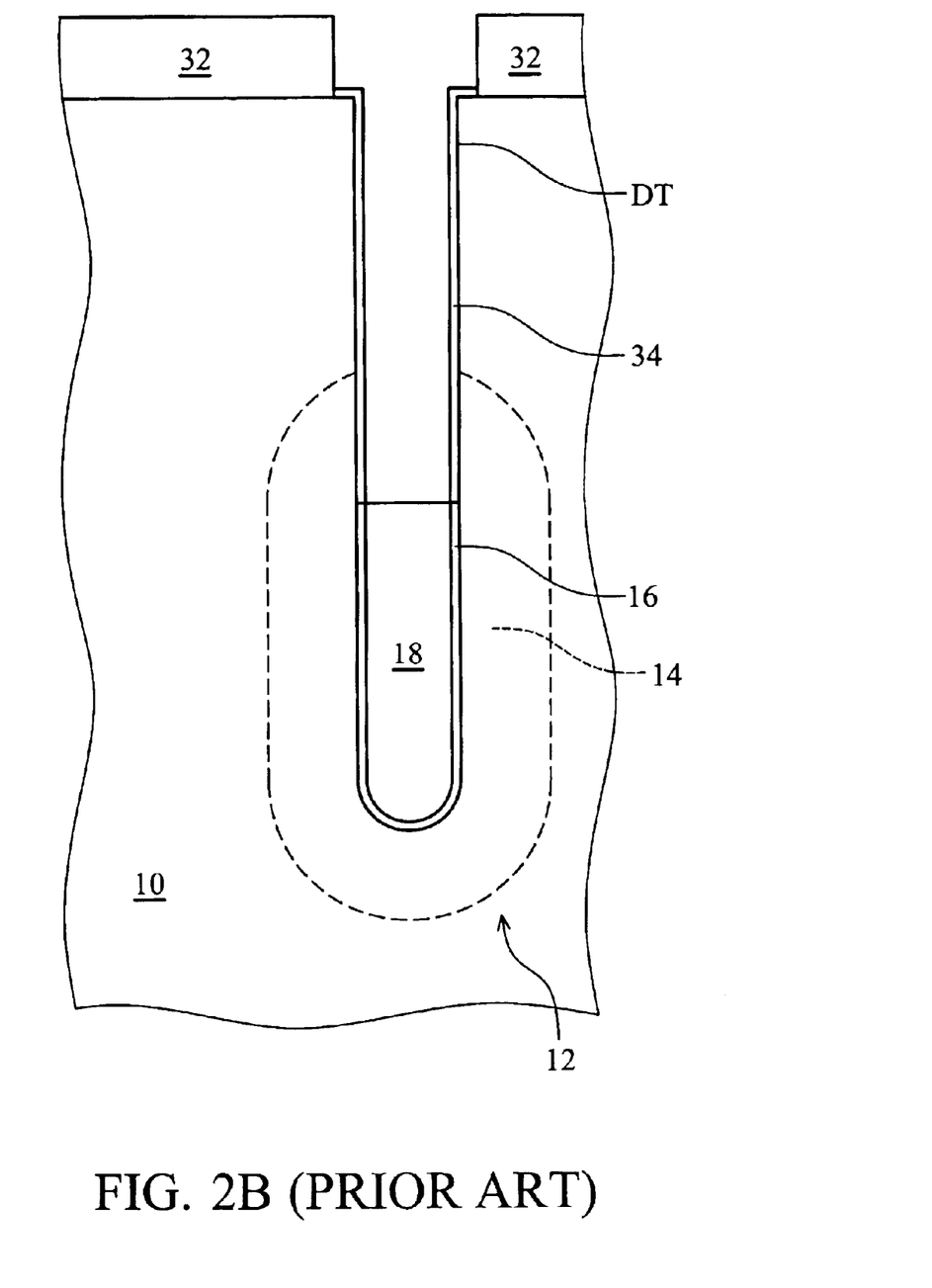
Figure 2C:
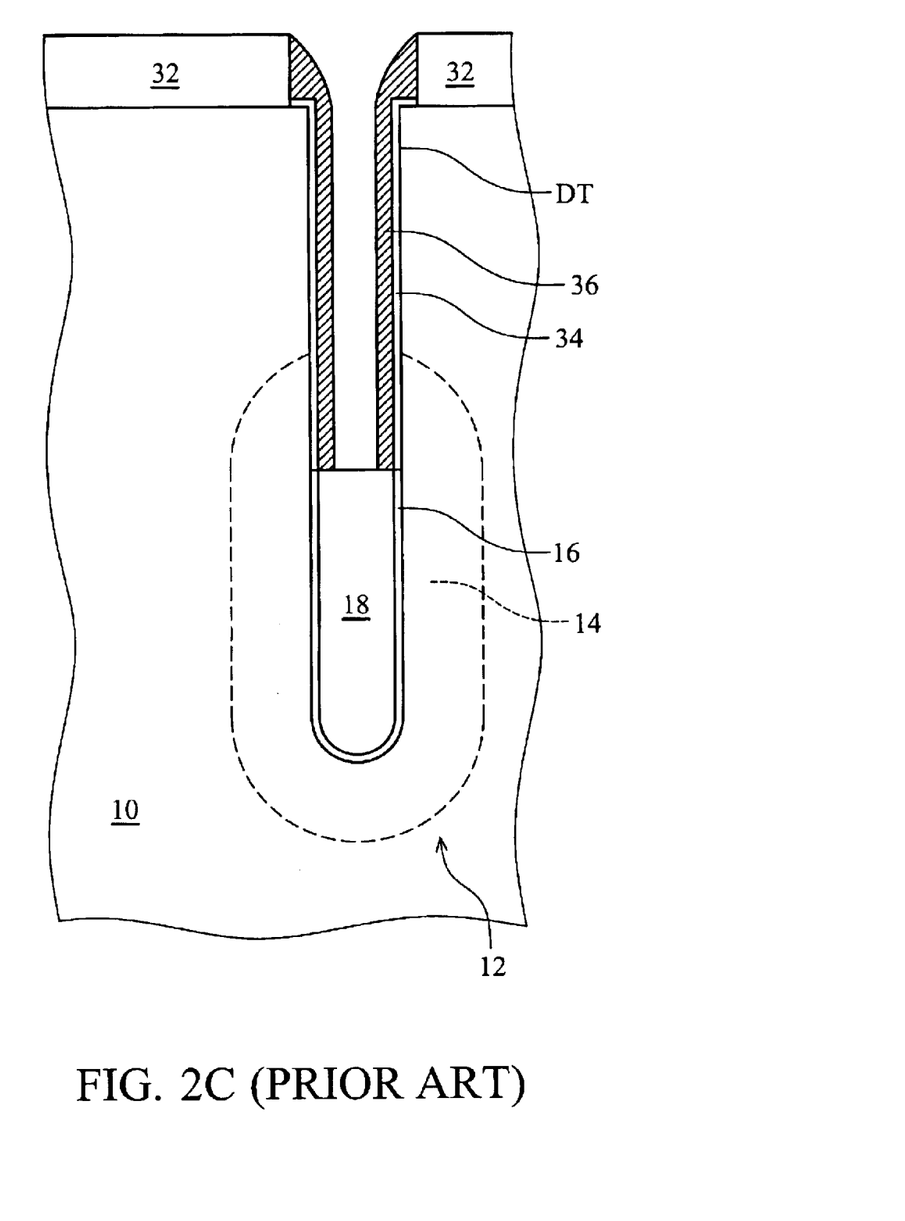
Figure 2D:
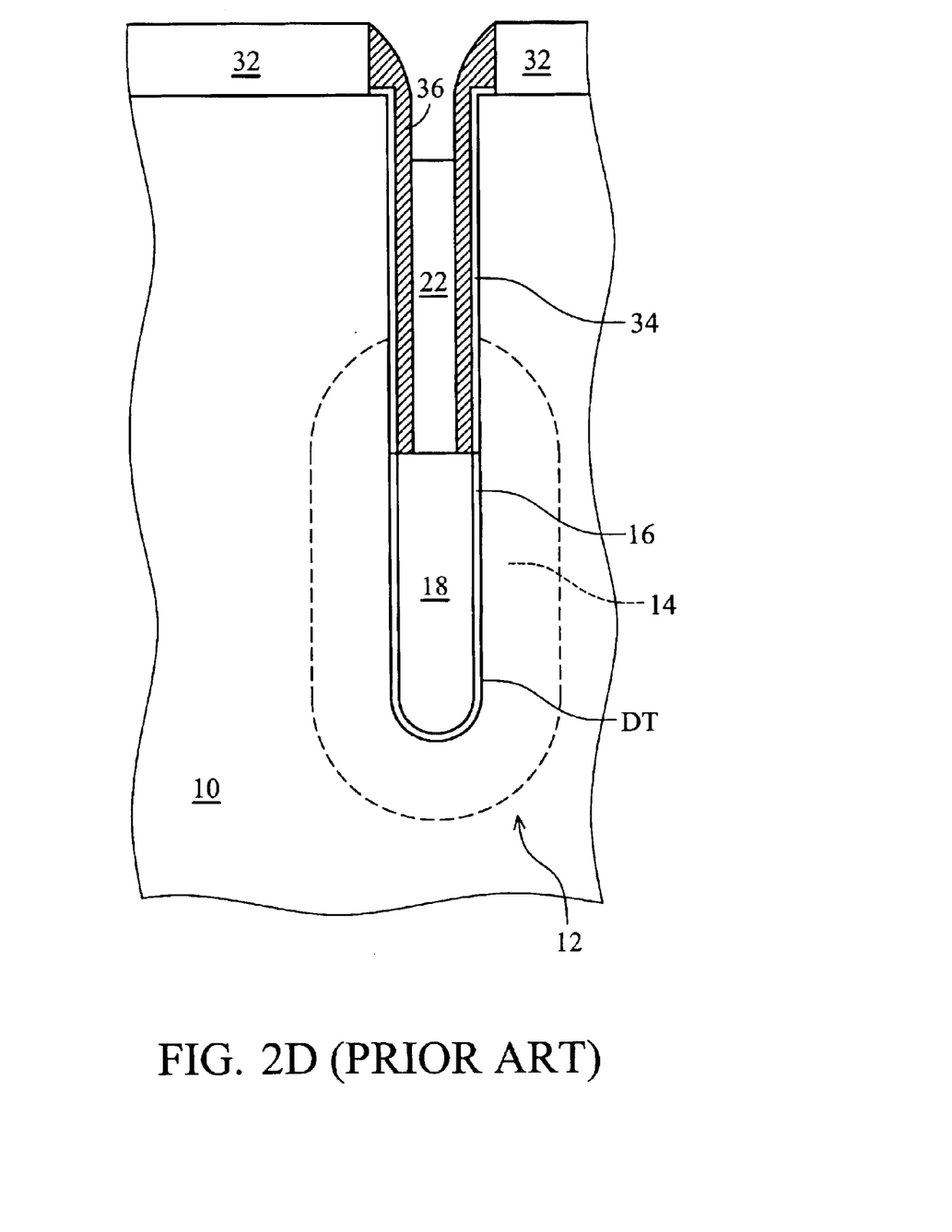

Next, in FIG. 2D, the second $n^+$-doped polysilicon layer 22 is deposited to fill the deep trench DT, after which it is recessed to reach a predetermined depth. Finally, in FIG. 2E, a wet etching method is employed to remove portions of the second silicon oxide layer 36 and the first silicon oxide layer 34 until the top of the second polysilicon layer 22 protrudes from the second silicon oxide layer 36 and the first silicon oxide layer 34. Thus, the remaining portion of the second silicon oxide layer 36 and the first silicon oxide layer 34 serves as the collar dielectric layer 20.

Figure 2E:
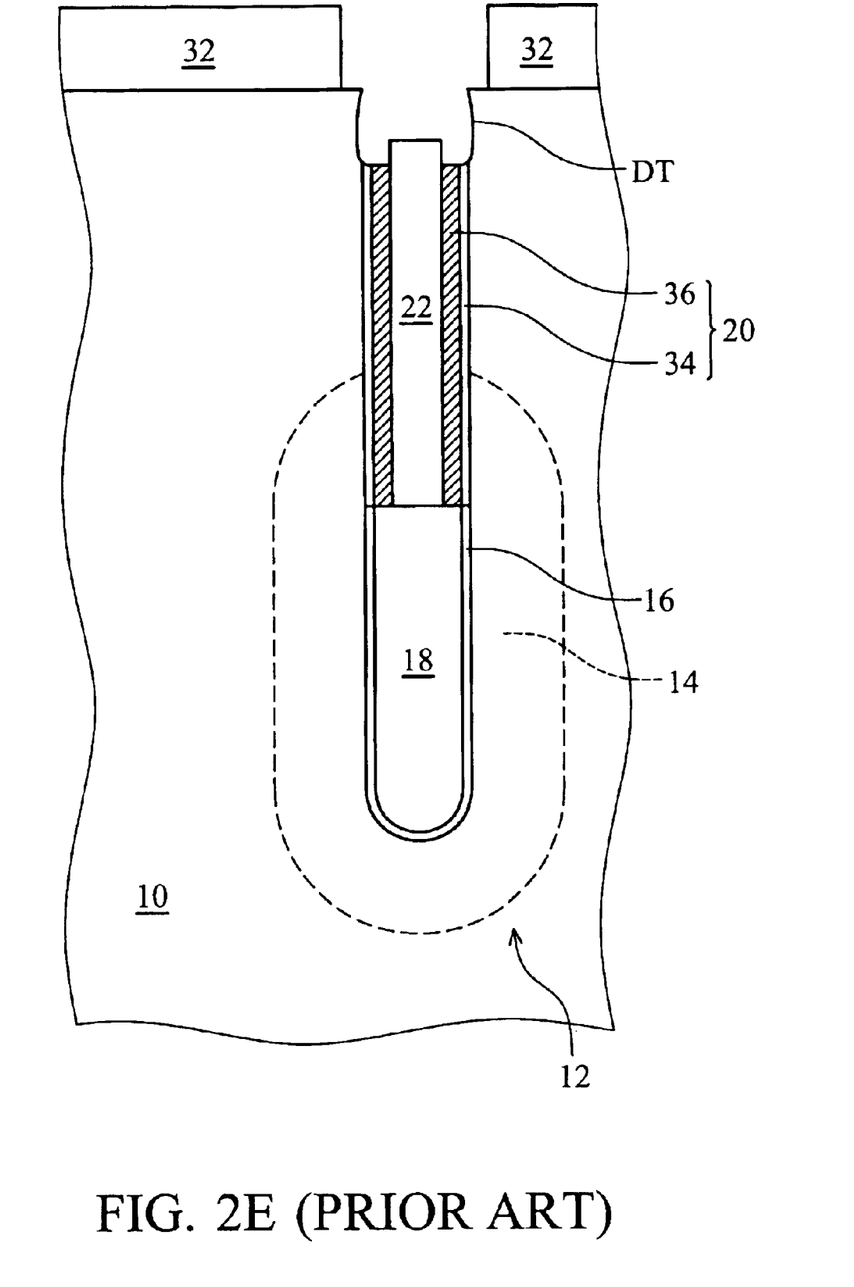

During the oxidation process for growing the first silicon oxide layer 34, a part of the silicon substrate 10 is converted into $SiO_2$, thus the top width of the deep trench DT is increased through the subsequent wet etching process. This reduces an overlay margin area L between the source/drain diffusion regions 28 and the buried strap outdiffusion region 30, resulting in serious junction leakage and worse sub-Vt. The oxidation process for the first silicon oxide layer 34 is the main factor in increasing the top width of the deep trench DT, but is important nonetheless, and cannot be skipped as more serious junction leakage will occur if the first silicon oxide layer 34 is thinned or omitted. Accordingly, based on the prerequisite oxidation for the first silicon oxide layer 34, a novel collar dielectric process of reducing the top width of the deep trench DT is called for.

SUMMARY OF THE INVENTION

Accordingly, an object of the present invention is to provide a collar dielectric process with an ion implantation process for selectively growing a silicon oxide layer on the sidewall of a deep trench outside a buried strap outdiffusion region.

According to the object of the invention, a collar dielectric process for reducing a top width of a deep trench has the following steps. A semiconductor silicon substrate has a deep trench and a deep trench capacitor. The deep trench capacitor has a node dielectric formed on the sidewall and bottom of the deep trench, and a storage node formed in the deep trench and reaching a predetermined depth. An ion implantation process is performed to form an ion implantation area on the substrate at the top of the deep trench. The node dielectric is then removed until the top of the node dielectric is leveled off with the top of the storage node, thus exposing the sidewall of the deep trench outside the deep trench capacitor. Next, an oxidation process is performed to grow a first silicon oxide layer on the exposed sidewall of the deep trench, in which the first silicon layer is outside the ion implantation area.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention is a collar dielectric process for reducing a top width of a deep trench over a deep trench capacitor. Also, the collar dielectric process ensures the isolation result between a buried strap outdiffusion region at the top of the deep trench and a buried plate at the lower portion of the deep trench so as to prevent damages to the sub-Vt performance from leakage therebetween. Preferably, the collar dielectric process is applied to a DRAM cell including a transistor coupled to a deep trench capacitor, in which the transistor is a planar or vertical type.

FIGS. 3A to 3F are cross-sections illustrating a collar dielectric process of the present invention.

Figure 3A:
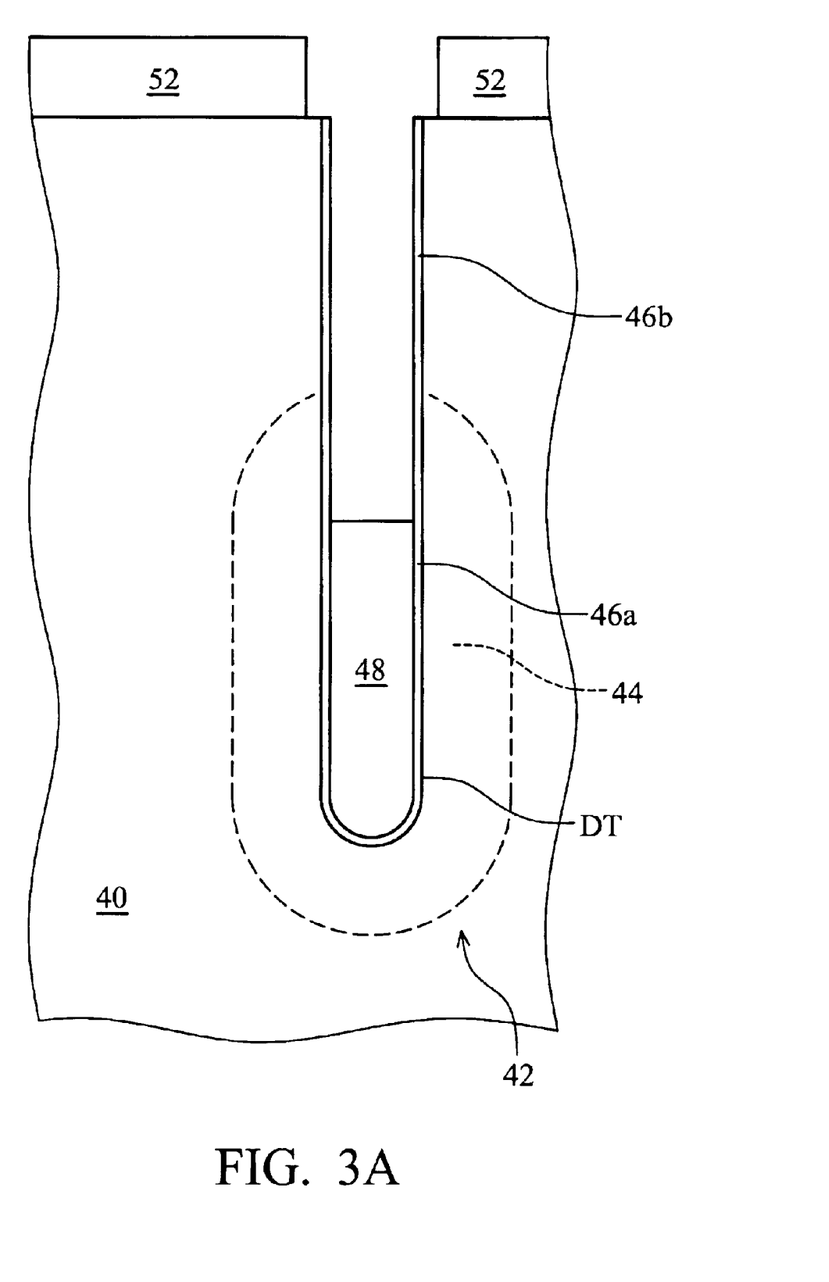
FIGS. 3A to 3F are cross-sections illustrating a collar dielectric process of the present invention.

In FIG. 3A, a deep trench DT is formed in a silicon substrate 40, and a deep trench capacitor 42 is completed at the lower portion of the deep trench DT. The formation of the deep trench capacitor 42 composed of a buried plate, a node dielectric and a storage node employs the following steps. First, using a reactive ion etching (RIE) method with a pad layer 52 as a pattern mask, the deep trench DT is formed in the p-type silicon substrate 40. Then, using a heavily-doped oxide material (such as ASG) with a high-temperature, short-term annealing process, $n^+$ions are diffused into the silicon substrate 40 at the lower portion of the deep trench DT, thus forming an $n^+$-type diffusion region 44 as the buried plate of the deep trench capacitor 42. Next, a silicon nitride layer 46 is deposited on the sidewall and bottom of the lower portion of the deep trench DT. Next, a first $n^+$-doped polysilicon layer 48 is deposited to fill the deep trench DT after which it is recessed to reach a predetermined depth, thus serving as the storage node of the deep trench capacitor 42. The silicon nitride layer 46a formed at the lower portion of the deep trench DT and sandwiched between the buried plate and the storage node serves as the node dielectric of the deep trench capacitor 42.

Figure 3B:
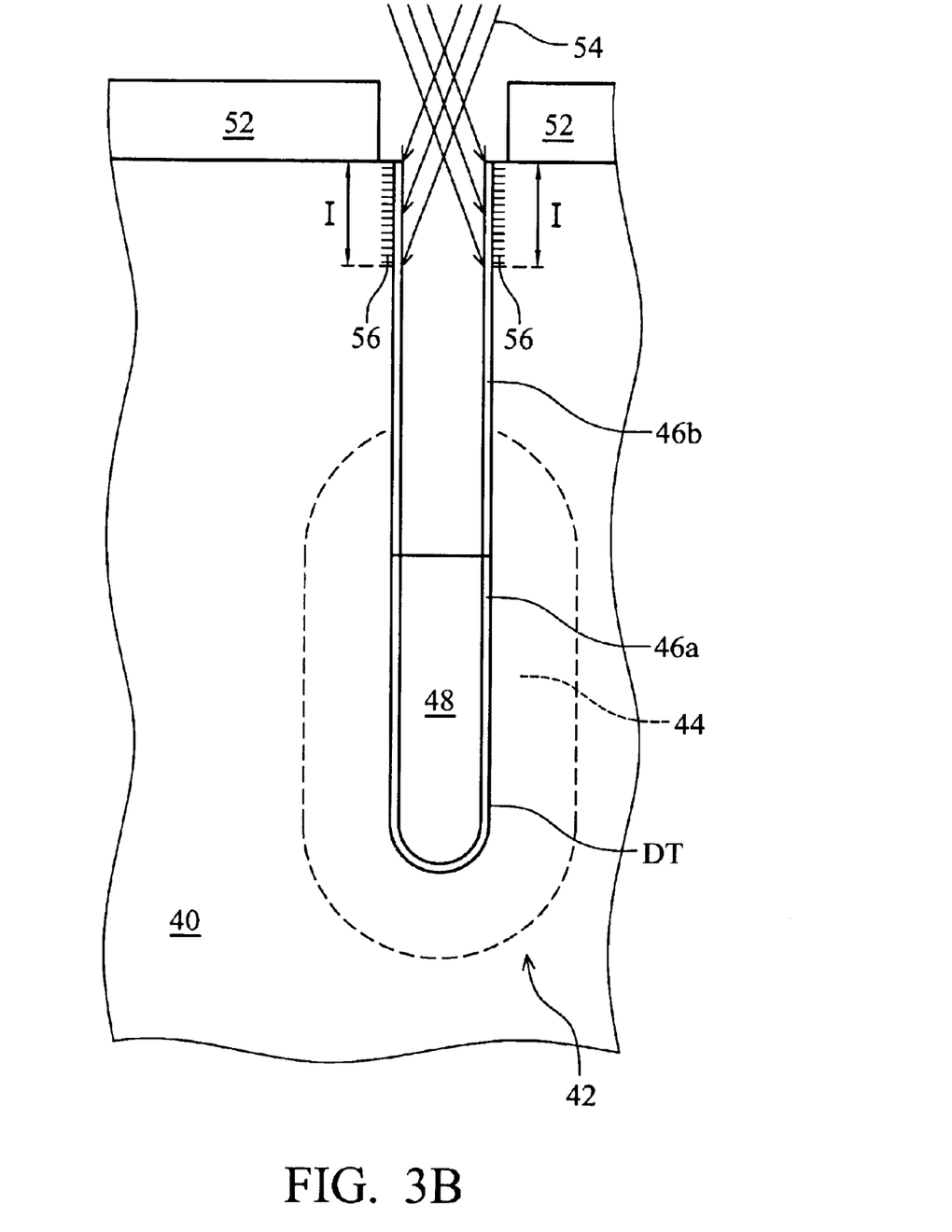

In FIG. 3B, before removing the silicon nitride layer 46b from the upper portion of the deep trench DT, an ion implantation process 54 is performed with the silicon nitride layer 46 as a screen layer to form an ion implantation area 56 in the silicon substrate 40 at the top portion of the deep trench DT. Preferably, the position and vertical length l of the ion implantation area 56 substantially correspond to those of a buried strap outdiffusion region which will be formed in subsequent processes. Preferably, the ion implantation process 54 uses a tilt-angle implantation with N2 as the ion source, and the vertical length l of the ion implantation area 56 is approximately 800–1500 Å.

Figure 3C:
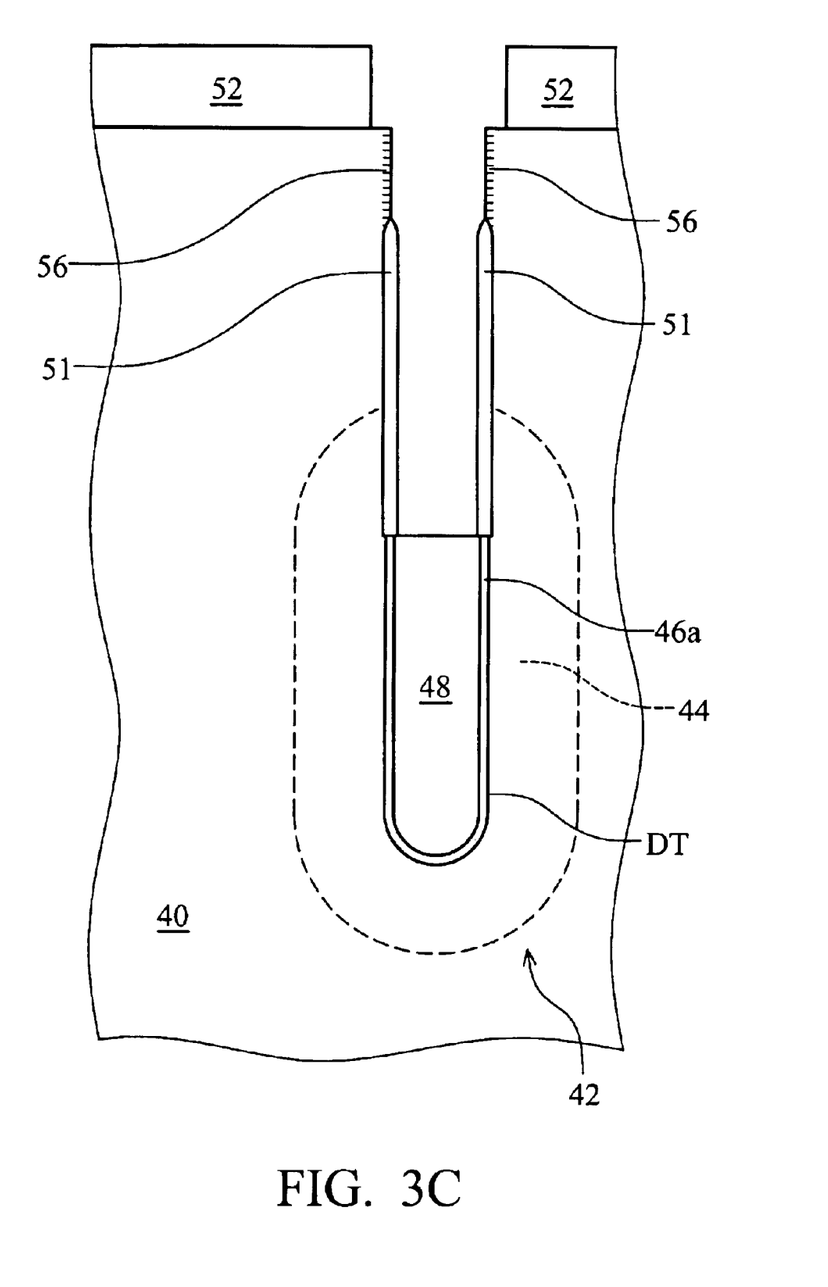

In FIG. 3C, the silicon nitride layer 46b is removed from the upper portion of the deep trench DT, after which a first silicon oxide layer 51 is grown on the exposed surface of the silicon substrate 40 through an oxidation process. It is noted that the above-described ion implantation process 54 restrains the silicon substrate 40 at the top of the deep trench DT from converting into $SiO_2$ during the oxidation process, thus the first silicon oxide layer 51 is merely grown on the exposed silicon substrate 40 outside the ion implantation area 56. The first silicon oxide layer 51 ensures the isolation result between the $n^+$-type diffusion region 44 and a buried strap outdiffusion region which will be formed in subsequent processes.

Figure 3D:
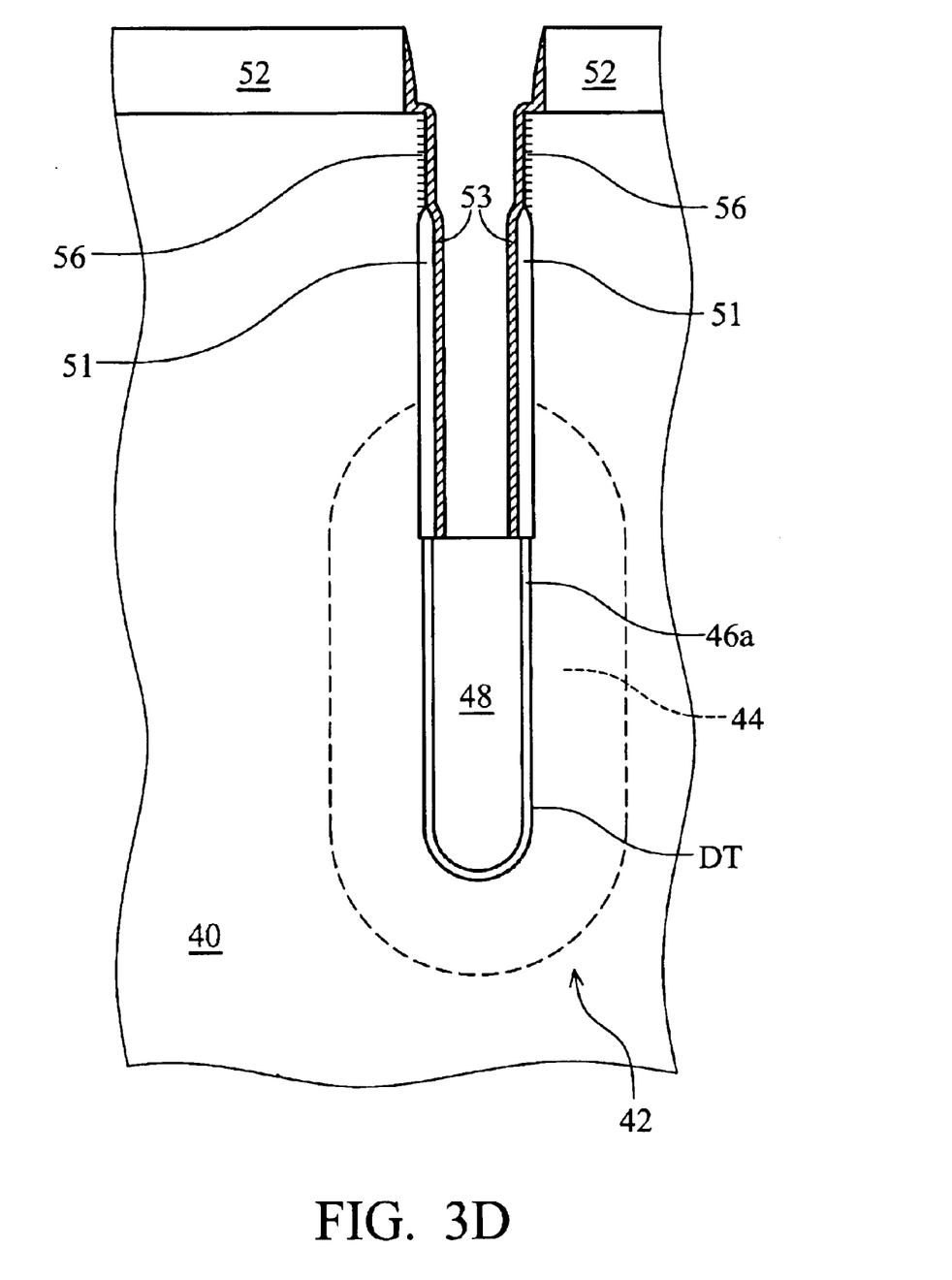

In FIG. 3D, using a CVD method or other deposition processes, a second silicon oxide layer 53 is conformally deposited on the sidewall and bottom of the deep trench DT. Then, a dry etching method is used to remove the second silicon oxide layer 53 from the top of the first polysilicon layer 48.

Figure 3E:
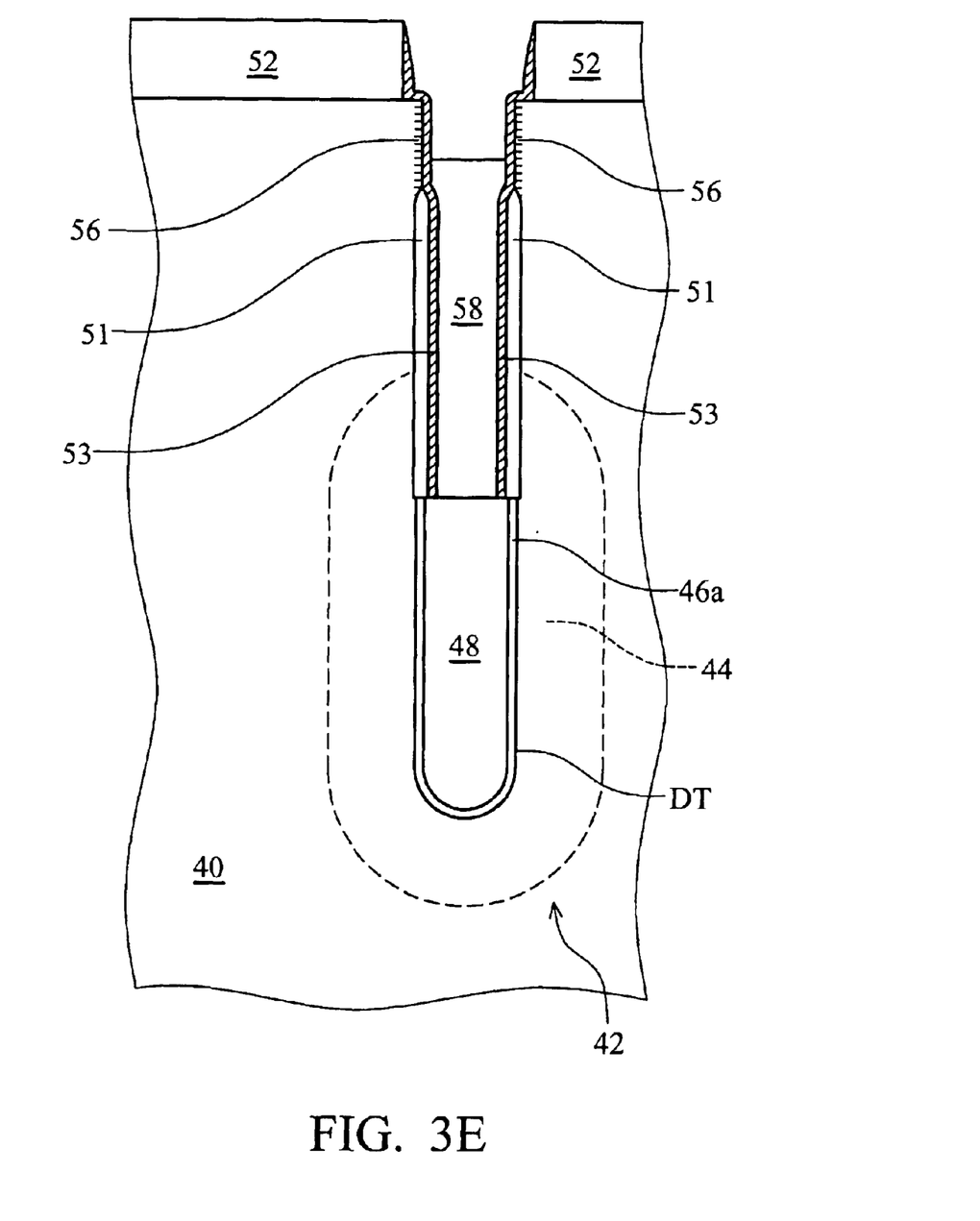

In FIG. 3E, a second $n^+$-doped polysilicon layer 58 is deposited to fill the deep trench DT, after which it is recessed to reach a predetermined depth.

Figure 3F:
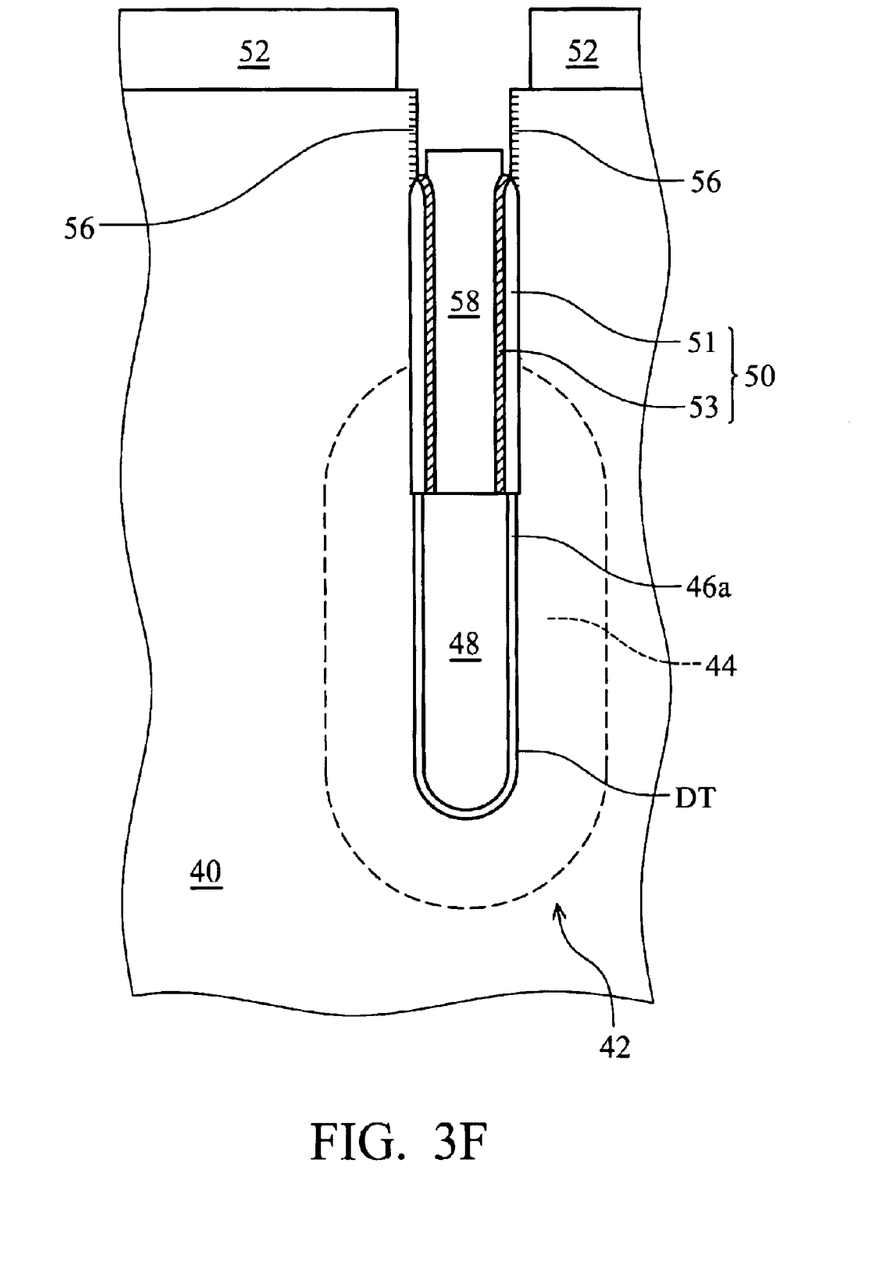

In FIG. 3F, using a wet etching method, portions of the second silicon oxide layer 53 and the first silicon oxide layer 51 are removed and leveled with each other until the top of the second polysilicon layer 58 protrudes from the second silicon oxide layer 53 and the first silicon oxide layer 51. Thus, the combination of the second silicon oxide layer 53 and the first silicon oxide layer 51 remaining on the sidewall of the deep trench DT serve as a collar dielectric layer 50.

Figure 4A:
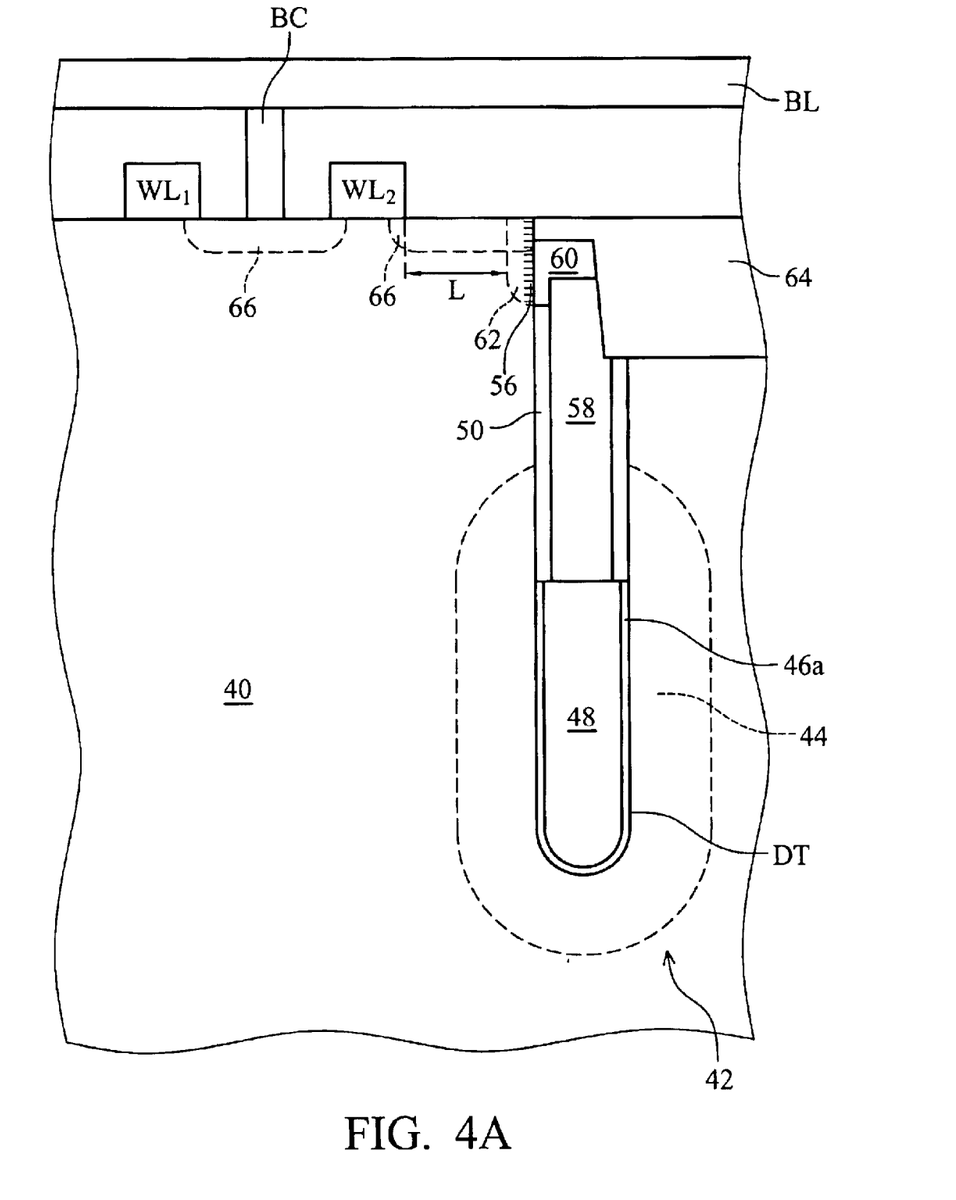
FIG. 4A is a cross-section illustrating a DRAM cell with the collar dielectric layer shown in FIG. 3F.

FIG. 4A is a cross-section illustrating a DRAM cell with the collar dielectric layer 50 shown in FIG. 3F. After completing the collar dielectric layer 50, the following steps of forming a third polysilicon layer 60 (also called a buried strap), a buried strap outdiffusion region 62, an STI structure 64, two word lines $WL_1$ and $WL_2$, a source/drain diffusion region 66, a bit line contact BC and a bit line BL are performed thereon.

According to the above-described collar dielectric process, the ion implantation area 56 is formed corresponding to the buried strap outdiffusion region 62 before removing the silicon nitride layer 46b, and the first silicon oxide layer 51 is selectively grown on the silicon substrate 40 outside the buried strap outdiffusion region 62, thus the wet etching process for removing the first silicon oxide layer 51 does not increase the top width of the deep trench DT.

Compared with the conventional collar dielectric method which increases the top width of the deep trench, it has been experimentally proven that the collar dielectric process of the present invention can reduce the top width of the opening radius of the deep trench to 40–60 Å. Thus, an overlay margin area L between the source/drain diffusion region 66 and the buried strap outdiffusion region 62 is reduced so as to solve the junction leakage problem and improve the sub-Vt performance. Additionally, the only modification to the conventional collar dielectric process required by present invention is the ion implantation process 54 for the ion implantation area 56. The process is further simplified by not requiring an extra photoresist patterning process for the above mentioned ion implantation process and performs other steps as usual. Thus the invention has the advantages of a simplified procedure, low process cost, and is well suited to mass production.

Figure 4B:
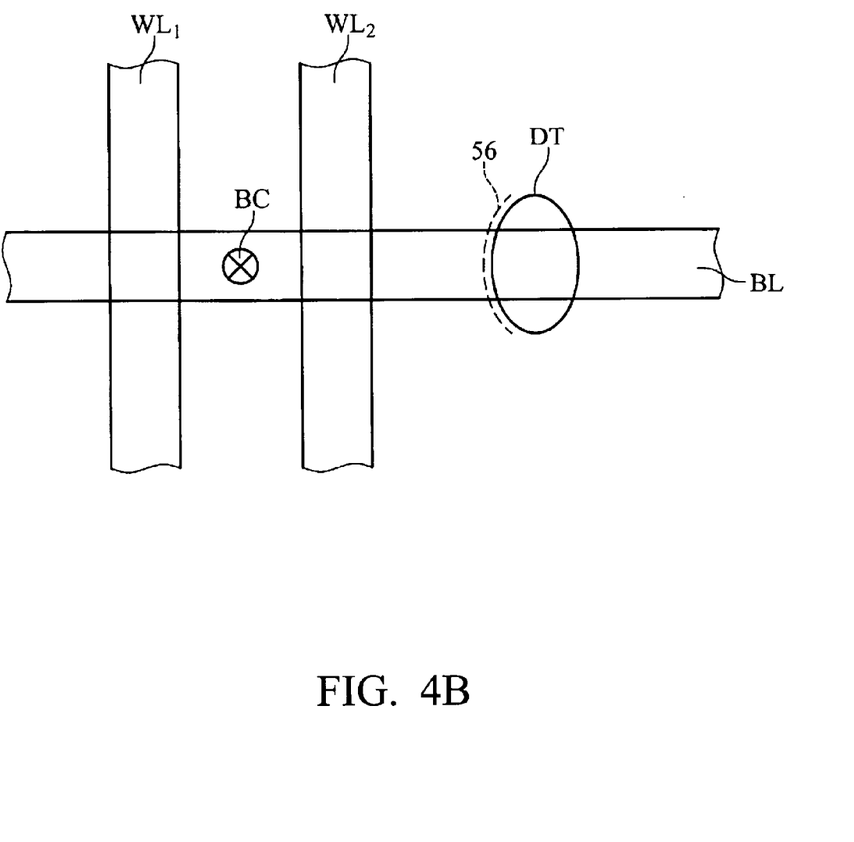
FIGS. 4B and 4C are plane views illustrating the arrangement of deep trenches, word lines and bit lines of the DRAM cell shown in FIG. 4A.
Figure 4C:
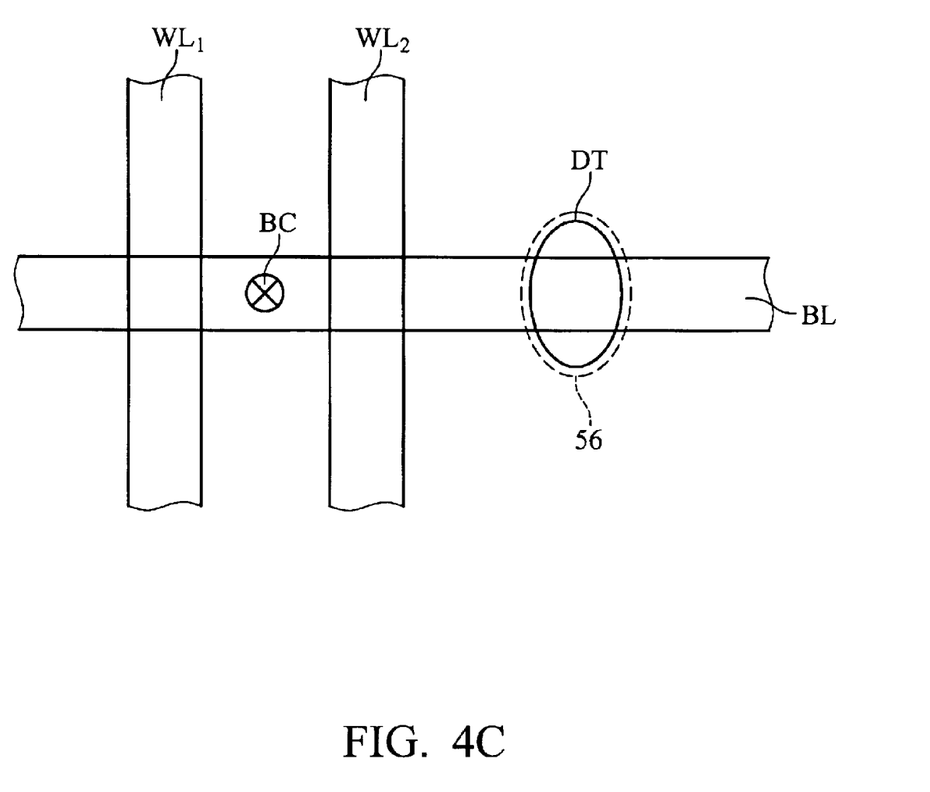

FIGS. 4B and 4C are plane views illustrating the arrangement of deep trenches DT, word lines $WL_1$ and $WL_2$, a bit line contact BC and a bit line BL of the DRAM cell shown in FIG. 4A. In one embodiment of the present invention, as shown in FIG. 4B, the ion implantation area 56 partially surrounds the top of the deep trench DT and is adjacent to the second word line $WL_2$. In the other embodiment of the present invention, as shown in FIG. 4C, the ion implantation area 56 entirely surrounds the top of the deep trench DT.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A collar dielectric process, comprising the steps of:
   providing a semiconductor silicon substrate having a deep trench and a deep trench capacitor, in which the deep trench capacitor comprises a node dielectric formed on the sidewall and bottom of the deep trench and a storage node formed in the deep trench and reaching a predetermined depth;
   performing an ion implantation process to form an ion implantation area in the substrate at the top of the deep trench, wherein the ion implantation process partially surrounds a partial top of the deep trench and is adjacent to a buried strap outdiffusion region;
   removing the node dielectric until the top of the node dielectric is leveled off with the top of the storage node, thus exposing the sidewall of the deep trench outside the deep trench capacitor; and
   performing an oxidation process to grow a first silicon oxide layer on the exposed sidewall of the deep trench, in which the first silicon layer is outside the ion implantation area.

2. The collar dielectric process as claimed in claim 1, wherein the ion implantation process uses N2 as the ion source to restrain the growth of the first silicon oxide layer.

3. The collar dielectric process as claimed in claim 1, wherein the position and vertical length of the ion implantation area corresponds to those of a buried strap outdiffusion region.

4. The collar dielectric process as claimed in claim 1, wherein the ion implantation process entirely surrounds the top of the deep trench.

5. The collar dielectric process as claimed in claim 1, wherein the vertical length of the ion implantation area is 800–1500 Å.

6. The collar dielectric process as claimed in claim 1, wherein the node dielectric is a silicon nitride layer.

7. The collar dielectric process as claimed in claim 1, wherein the storage node is an n+-doped polysilicon layer.

8. The collar dielectric process as claimed in claim 1, wherein the deep trench capacitor further comprises a buried plate which is an $n^+$-type diffusion region formed in the substrate at the lower portion of the deep trench and surrounding the node dielectric.

9. The collar dielectric process as claimed in claim 1, further comprising the steps of:
   forming a second silicon oxide layer on the sidewall of the deep trench to cover the first silicon oxide layer and the ion implantation area;
   forming a first conductive layer in the deep trench to connect the top of the storage node;
   recessing the first conductive layer until reaching a predetermined depth; and
   etching the second silicon oxide layer and the first silicon oxide layer to level off the top of the second silicon oxide layer and the top of the first silicon oxide layer until the top of the first conductive layer protrudes from the tops of the second silicon oxide layer and the first silicon oxide layer, wherein the combination of the second silicon oxide layer and the first silicon oxide layer remaining on the sidewall of the deep trench serve as a collar dielectric layer.

10. The collar dielectric process as claimed in claim 9, wherein the first conductive layer is an n+-doped polysilicon layer.

11. The collar dielectric process as claimed in claim 9, further comprising the steps of:
   forming a second conductive layer in the deep trench; and
   forming a buried strap outdiffusion region in the silicon substrate adjacent to the second conductive layer, wherein the position and vertical length of the buried strap outdiffusion region correspond to those of the ion implantation area.

12. The collar dielectric process as claimed in claim 11, wherein the second conductive layer is a polysilicon layer.

13. The collar dielectric process as claimed in claim 11, wherein the buried strap outdiffusion region is an n+-type diffusion region.

* * * * *